(12) United States Patent
Campbell et al.

(10) Patent No.: US 9,363,934 B2
(45) Date of Patent: Jun. 7, 2016

(54) CONTROLLING ACCESS TO COMPONENTS IN A SERVER HOUSING TO ENFORCE USE OF A GROUNDING STRAP

(71) Applicant: Lenovo Enterprise Solutions (Singapore) Pte. Ltd., Singapore (SG)

(72) Inventors: Keith M. Campbell, Cary, NC (US); James G. McLean, Fuquay-Varina, NC (US); William M. Megarity, Raleigh, NC (US); Luke D. Remis, Raleigh, NC (US); Gregory D. Sellman, Morrisville, NC (US); Christopher L. Wood, Greenville, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 318 days.

(21) Appl. No.: 14/084,261

(22) Filed: Nov. 19, 2013

(65) Prior Publication Data

US 2015/0138728 A1    May 21, 2015

(51) Int. Cl.
*H02H 1/00* (2006.01)
*H05K 9/00* (2006.01)

(52) U.S. Cl.
CPC .................................... *H05K 9/0067* (2013.01)

(58) Field of Classification Search
USPC ......................................................... 361/212
See application file for complete search history.

(56) References Cited

U.S. PATENT DOCUMENTS

| | | | |
|---|---|---|---|
| 4,710,751 A | 12/1987 | Webster | |
| 4,722,025 A * | 1/1988 | Robinson | H05K 9/0067 206/719 |
| 5,408,186 A * | 4/1995 | Bakhoum | G01R 31/026 324/509 |
| 5,457,596 A | 10/1995 | Yang | |
| 6,035,260 A * | 3/2000 | Pohribnij | A61N 1/08 361/220 |
| 6,150,945 A | 11/2000 | Wilson | |
| 6,671,160 B2 * | 12/2003 | Hayden | H05F 3/02 361/212 |
| 6,771,566 B2 | 8/2004 | Lee | |
| 6,809,522 B2 * | 10/2004 | Nguyen | G01R 31/002 324/457 |
| 6,866,128 B2 | 3/2005 | Moore et al. | |
| 6,930,612 B1 * | 8/2005 | Kraz | G08B 21/185 340/649 |
| 7,085,120 B2 * | 8/2006 | Kraz | A61N 1/14 361/220 |
| 7,353,120 B2 * | 4/2008 | Enta | H01L 22/14 257/E21.531 |
| 7,764,184 B2 * | 7/2010 | Dobbs | G06F 11/3058 340/539.22 |
| 8,866,629 B2 * | 10/2014 | Anderson | G06F 11/0748 340/649 |

OTHER PUBLICATIONS

ACL Incorporated, "ACL 600 Stati-Check Meter—Operation Manual", Chicago, IL, Rev. Jun. 23, 2010 KCB, pp. 1-5.

* cited by examiner

*Primary Examiner* — Rodney Fuller
(74) *Attorney, Agent, or Firm* — Katherine S. Brown; Jeffrey L. Streets (57) ABSTRACT

A method includes sensing ambient conditions in a datacenter containing a server, and determining whether the ambient conditions exceed predetermined threshold conditions representing risk of electrostatic discharge. A lid to the server is locked in a closed position in response to the ambient conditions exceeding the predetermined threshold conditions. However, the lid to the server is unlocked in response to a grounding strap being connected to the server. Optionally, the grounding strap may be identified and the server lid will only unlock if the identified grounding strap is associated with authorization to unlock the server lid.

20 Claims, 5 Drawing Sheets

CONTROLLING ACCESS TO COMPONENTS IN A SERVER HOUSING TO ENFORCE USE OF A GROUNDING STRAP

BACKGROUND

1. Field of the Invention

The present invention relates to systems and method to prevent damage to components within a server due to a buildup of electrostatic charge.

2. Background of the Related Art

A buildup of electrostatic charge (or static electricity) can lead to an electrostatic discharge that has the potential to damage sensitive electronic components, such as integrated circuits and memory. To avoid such damage, it is recommended that a person working on sensitive electronic components utilize various antistatic devices that drain static charge to ground. Such antistatic devices may include conductive floor mats, touch bars, and a grounding strap or wristband. A grounding strap includes and conductive band worn around the wrist of a person working on or near the sensitive electronic components, as well as a conductive wire that is coupled between the grounding strap and an electrically grounded element. Accordingly, static electrostatic charge associated with the person is safely drained off to ground before the electrostatic charge can build up to the point that there may be an electrostatic discharge.

BRIEF SUMMARY

One embodiment of the present invention provides a method, comprising sensing ambient conditions in a datacenter containing a server, determining whether the ambient conditions exceed predetermined threshold conditions representing risk of electrostatic discharge, locking a lid to the server in a closed position in response to the ambient conditions exceeding the predetermined threshold conditions, detecting whether a grounding strap is connected to the server, and unlocking the lid to the server in response to the grounding strap being connected to the server.

Another embodiment of the present invention provides a method, comprising locking a lid to the server in a closed position, detecting that a grounding strap is connected to the server, identifying the grounding strap connected to the server, determining whether the identified grounding strap is authorized to unlock the lid, and unlocking the lid to the server in response to the determining that the identified grounding strap connected to the server is authorized to unlock the lid.

DETAILED DESCRIPTION

One embodiment of the present invention provides a method, comprising sensing ambient conditions in a datacenter containing a server, determining whether the ambient conditions exceed predetermined threshold conditions representing risk of electrostatic discharge, locking a lid to the server in a closed position in response to the ambient conditions exceeding the predetermined threshold conditions, detecting whether a grounding strap is connected to the server, and unlocking the lid to the server in response to the grounding strap being connected to the server. A typical datacenter may, for example, contain hundreds or thousands of servers, and aspects of the present invention may be implemented in any number of those servers.

The method may include sensing various aspects of the ambient conditions in a datacenter, such as the ambient air temperature, ambient air pressure, ambient humidity, or some combination thereof within the datacenter. Optionally, the method may sense the humidity in the datacenter. In one implementation, a humidity sensor communicates a sensed humidity level to a system management controller, which may then communicate the humidity level over a management network to a management controller of one or more of the servers. The management controller may then compare the sensed humidity level to the predetermined threshold conditions, such as a humidity setpoint, in order to determine whether to lock the lid to the server. For example, since lower humidity causes an increase in static shock risk, any sensed humidity that exceeds a setpoint, such as 40% humidity, may result in the lid being locked unless a proper grounding strap is detected. Alternatively, the predetermined threshold conditions may include an algorithm that factors in the magnitude of multiple ambient conditions, such as ambient air temperature, ambient air pressure, and the humidity, or calculates a rate of change for any one or more of the measured ambient conditions. In a further option, the sensed humidity may be displayed on a remotely accessible user interface or a display screen on a front of the server.

Detecting whether a grounding strap is connected to the server may include detecting whether a grounding strap plug has been connected to a grounding strap socket on the server. Separately, the method may energize a light emitting diode (LED) on an exterior surface of the server in response to locking the lid, such that a user is notified of the reason that the lid is locked.

In a further option, the server may be divided into multiple sections, such that each section has its own lid and lid lock. In such a configuration, the step of determining whether the ambient conditions exceed predetermined threshold conditions representing risk of electrostatic discharge, may include determining whether the ambient conditions exceed a first set of predetermined threshold conditions representing a sensitivity to electrostatic discharge of components within a first section and determining whether the ambient conditions exceed a second set of predetermined threshold conditions representing a sensitivity to electrostatic discharge of components within a second section. The use of different threshold conditions recognizes that the components within each section may have different sensitivities to electrostatic discharge. Furthermore, the step of locking a lid to the server in a closed position in response to the ambient conditions exceeding the predetermined threshold conditions, may include locking a first lid to the server in a closed position in response to the ambient conditions exceeding the first set of predetermined threshold conditions and locking a second lid to the server in a closed position in response to the ambient conditions exceeding the second set of predetermined threshold conditions. It is possible that a first lid would be locked and a second lid would not be locked. In a specific implementation, the first lid provides access to a first section that may house a CPU and the second lid provides access to a second section that may house memory. Still further, the server may have a third lid that provides access to a third section housing a fan, wherein the third lid has no lock. If the fans are completely insensitive to electrostatic discharge, there is no reason to lock the lid that provides access to the fans.

In embodiments of the server having multiple lids, it is possible that not all of the lids provide access to static sensitive components. For example, CPUs and DIMMs are extremely sensitive to electrostatic discharge, whereas fans are generally not regarded as static sensitive. Accordingly, lids to sections having components that are not sensitive to electrostatic discharge may not have a lock.

Another embodiment of the present invention provides a method, comprising locking a lid to the server in a closed position, detecting that a grounding strap is connected to the server, identifying the grounding strap connected to the server, determining whether the identified grounding strap is authorized to unlock the lid, and unlocking the lid to the server in response to the determining that the identified grounding strap connected to the server is authorized to unlock the lid.

A systems management controller on the server may store predetermined data identifying a plurality of grounding straps that are authorized to unlock the lid or multiple lids. An identified grounding strap may be compared with the stored data in order to determine whether the grounding strap is authorized to unlock the lid(s). Still further, a service processor on the server may detect a physical attribute of the grounding strap, wherein the physical attribute is selected from resonance, charge capability, and electrical resistance, and wherein a grounding strap having a predetermined physical attribute is authorized to unlock the lid.

In a specific example, the method may further include a service processor on the server reading an identification code from an electronically erasable programmable read-only memory (EEPROM) physically secured to the wrist strap device and in electronic communication with the wrist strap plug. For example, the identification code may identify a user, an authorization level or an authorization type. The method may therefore compare the identification code with a stored set of records, where each record includes an identification code and an associated authorization code. The server lid may then be unlocked in response to the identification code read from the EEPROM being associated with an authorization code required for access to the server. In one option, the authorization code required for access to the server varies based on the server type or model.

Again, the server may divided into multiple sections, where each section has a separate lid and lid lock. For example, the multiple sections may include a first section housing a CPU and a second section housing memory. Embodiments of the invention may use a single grounding strap socket regardless of which section is being access, or a each section may include its own grounding strap socket.

Locking an unlocking of a server lid may be controlled by a management controller on the server, such as a baseboard management controller or other service processor. A lock may be electronically actuated, for example by applying electrical current to a solenoid or transducer that drives a pin or latch into an opposing hole or channel. The actuator may be, for example, a linear actuator or a rotary actuator. For convenience of wiring, the lock is preferably secured to one side of the server housing and the pin or latch will engage a channel or catch that is part of the server lid.

Figure 1A:
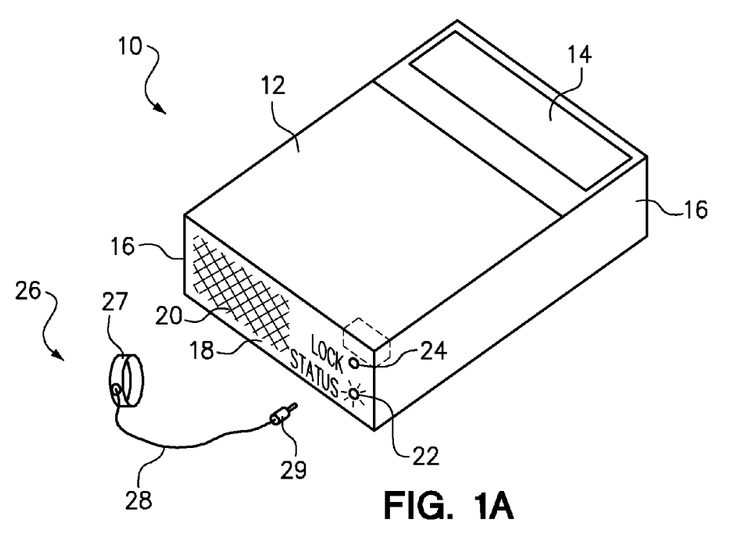
FIG. 1A is a diagram of a server housing with its lid closed.

FIG. 1A is a diagram of a server housing 10 with its lid 12 in a closed position. The server housing also has a second lid or cover 14 that is also in a closed position. The lids 12, 14 are secured to the server body 16. Collectively, the server body 16 and the lids 12, 14 for the server housing 10, which contains a server motherboard and supporting devices. As shown, the server housing 10 has a front panel 18 having a mesh region 20 allowing for the passage of air into the server housing, a "Lock Status" light emitting diode (LED) 22 for notifying a user that the server lid 12 is locked, and a ground strap socket 24. A grounding strap 26 includes a wrist strap 27 to be worn around a wrist of a user and a conductive wire 28 providing a conductive pathway from the wrist strap 27 to a grounding strap plug 29. When the grounding strap plug 29 is inserted into the grounding strap socket 24, the conductive wire is in electrical communication with grounded circuitry of the server.

Figure 1B:
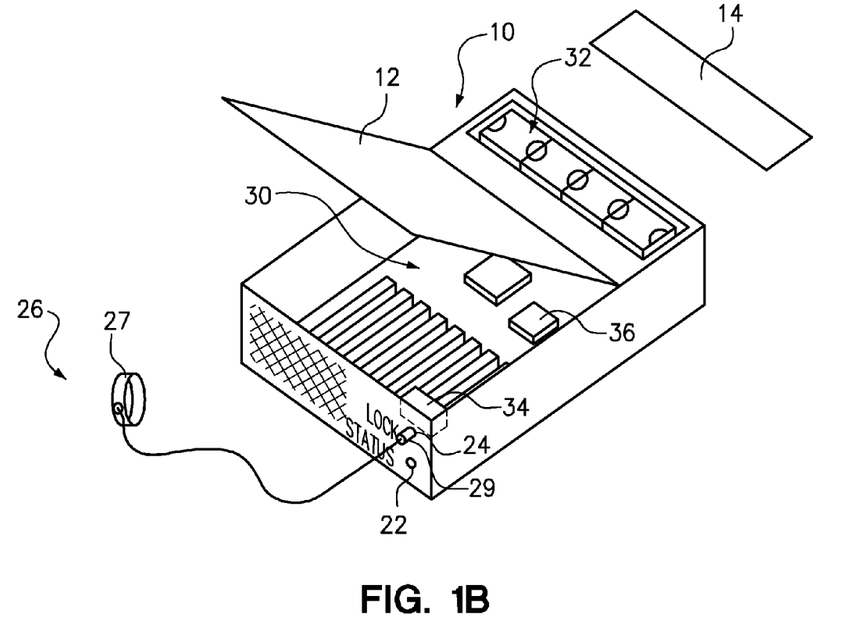
FIG. 1B is a diagram of a server housing with its lid open and a grounding strap coupled to the grounding strap socket on the server.

FIG. 1B is a diagram of the server housing 10 with its lid 12 open and the grounding strap 26 coupled to the grounding strap socket on the server. With the lid 12 in the open position, a user can access various components on the server motherboard 30 that is secured in the server housing 10. Furthermore, the second lid 14 has been removed to allow access to a fan assembly 32. In the embodiment shown, an electronically actuated lock 34 is positioned for selectively locking the lid 12 under the control of a management controller 36, such as a baseboard management controller. Accordingly, the lid 12 can be locked under various conditions to order to protect the components on the motherboard 30 that may be sensitive to electrostatic discharge. By contrast, the fans in the fan assembly 32 are insensitive to electrostatic discharge, such that there is no need to lock the second lid 14.

In accordance with various embodiments of the invention, the management controller 36 may detect the connection of the grounding strap plug 29 to the grounding strap socket 24 and unlock the lid 12 by controlling the lock 34. Accordingly, the lid 12 may then be manually opened or removed so that a user can access components within the server housing 10. Preferably, the management controller 36 will also turn off the Lock Status LED 22 at the time that the lid is unlocked. In practice, a user will put the wrist strap 27 around their wrist before and during access into the server housing 10. Optionally, when the grounding strap plug 29 is coupled to the grounding strap socket 24, the management controller may detect whether the wrist strap 27 is being worn by a user according to electrical parameters or characteristics of the grounding strap 26 that are different when being worn or not worn. Accordingly, the management controller 36 may, for example, only unlock the lid 12 if the sensed electrical parameters of the connected grounding strap 26 indicate that the wrist strap is actually being worn by a user.

Figure 2A:
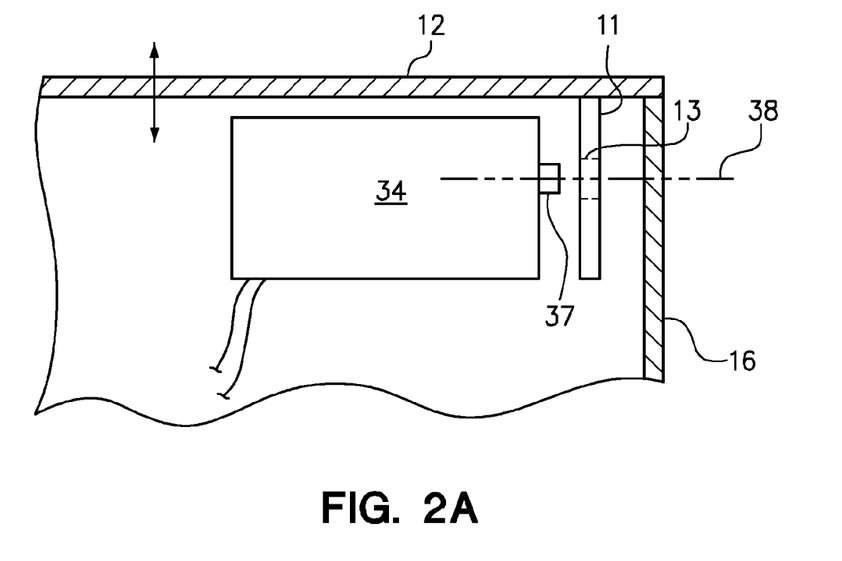
FIG. 2A is an end view of a server lid in the closed position disposing a channel in alignment with an electronic lock.

FIG. 2A is a partial cross-sectional end view of the server body 16 with the server lid 12 in the closed position. The lid 12 includes a bracket 11 having a channel or hole 13 there through. As shown, the bracket 11 is parallel with the adjacent wall of the server body 16 and the channel 13 shares a common axis 38 with an extendable pin 37 of the electronic lock 34 when the lid 12 is in the closed position shown. The electronic lock 34 is shown in an unlocked condition, such that the lid 12 may be removed.

Figure 2B:
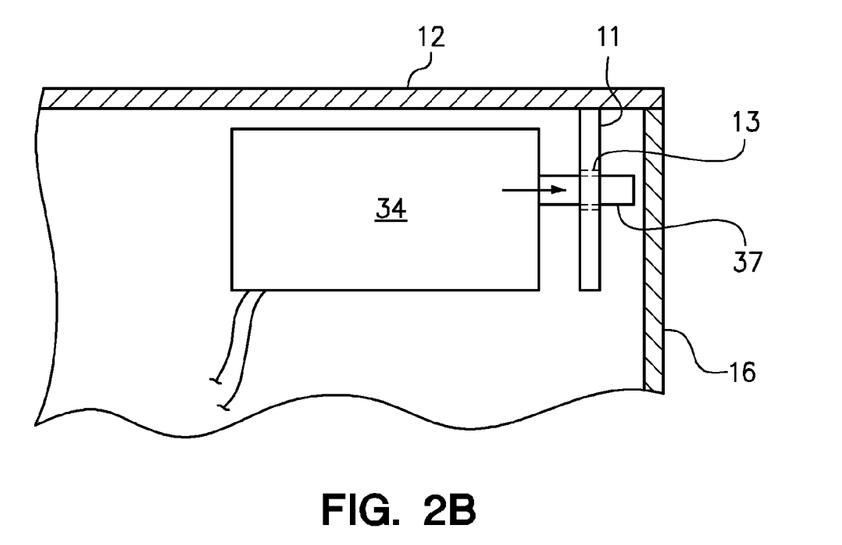
FIG. 2B is an end view of the server lid in the closed position with the electronic lock actuated to drive a pin in to the channel so that the lid is locked.

FIG. 2B is a partial cross-sectional end view of the server body 16 with the server lid 12 in the closed position with the electronic lock 34 actuated to drive the extendable pin 37 into the channel 13 so that the lid 12 is locked in place relative to the server body 16. The electronic lock 34 may include a solenoid, worm gear or other type of actuator. Furthermore, the lid 12 may be locked and unlocked using various other lock types and configurations. The lock shown is merely one illustration.

Figure 3:
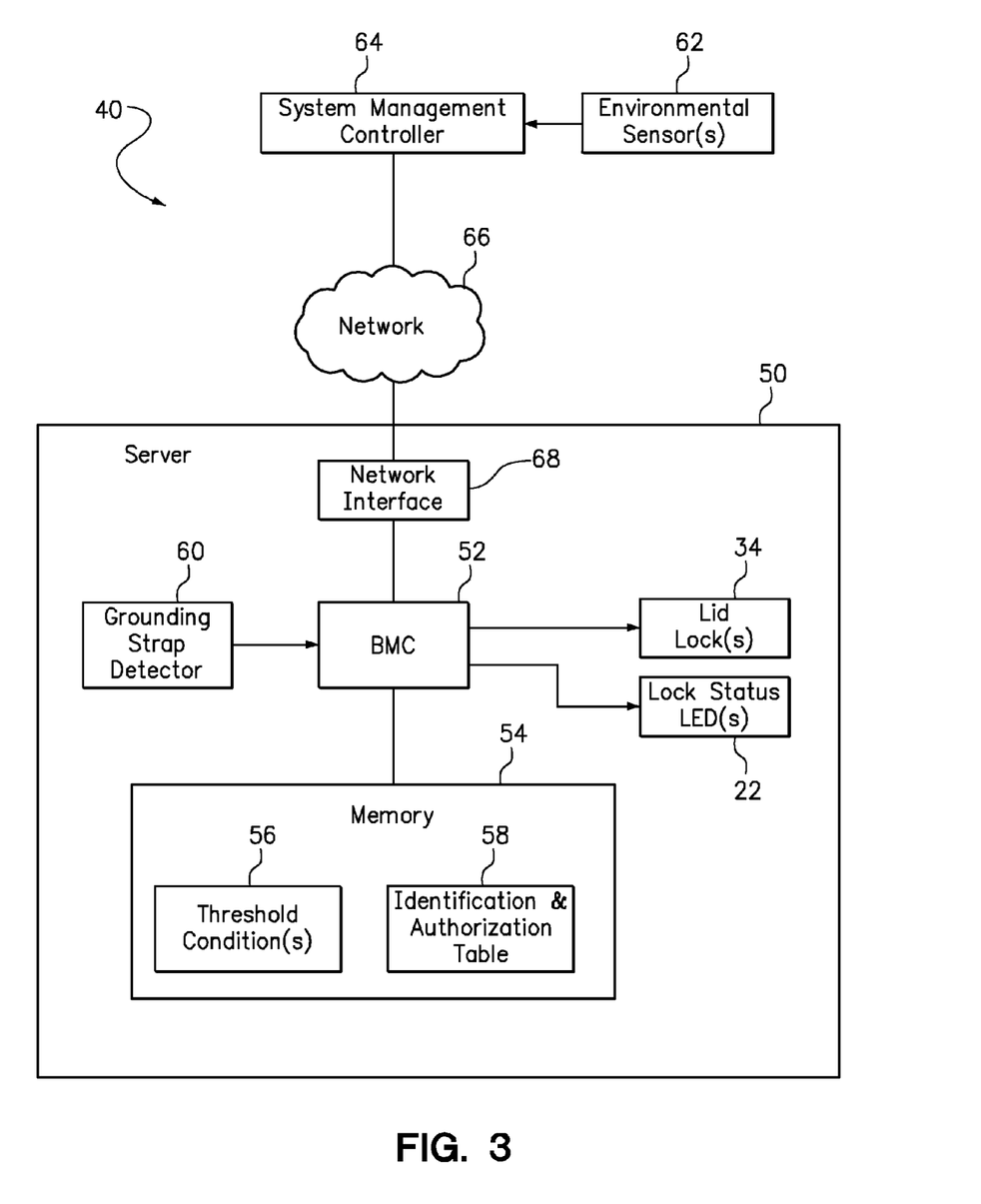
FIG. 3 is a block diagram of a system in accordance with one embodiment of the present invention.

FIG. 3 is a block diagram of a system 40 in accordance with one embodiment of the present invention. A server 50 includes a management controller, such as a baseboard management controller (BMC) 52. The BMC 52 has access to memory 54 that stores threshold conditions 56 where there is a risk of electrostatic discharge and also stores an identification and authorization table 58 in order to determine whether an identified grounding strap has authorization to access particular components (i.e., unlock a lid providing access to the particular components). The BMC 52 also receives input from a grounding strap detector 60 and generates control signals to the lid lock(s) 34 and the Lock Status LED(s) 22. Preferably, the server 50 includes a network interface 68 that allows the BMC 52 to communicate over a network 66.

An environmental sensor or sensors 62 measure one or more ambient conditions, such as humidity, in the datacenter where the server 50 is located. The environmental sensor 62 communicates the sensed ambient condition to a system management controller 64, which can communicate with the BMC 52 of any or all of the servers 50 in the datacenter. Accordingly, the BMC 52 has the ability to control the lid lock(s) 34 and Lock Status LED(s) 22 and has access to all of the information necessary to perform the methods of the present invention.

Figure 4:
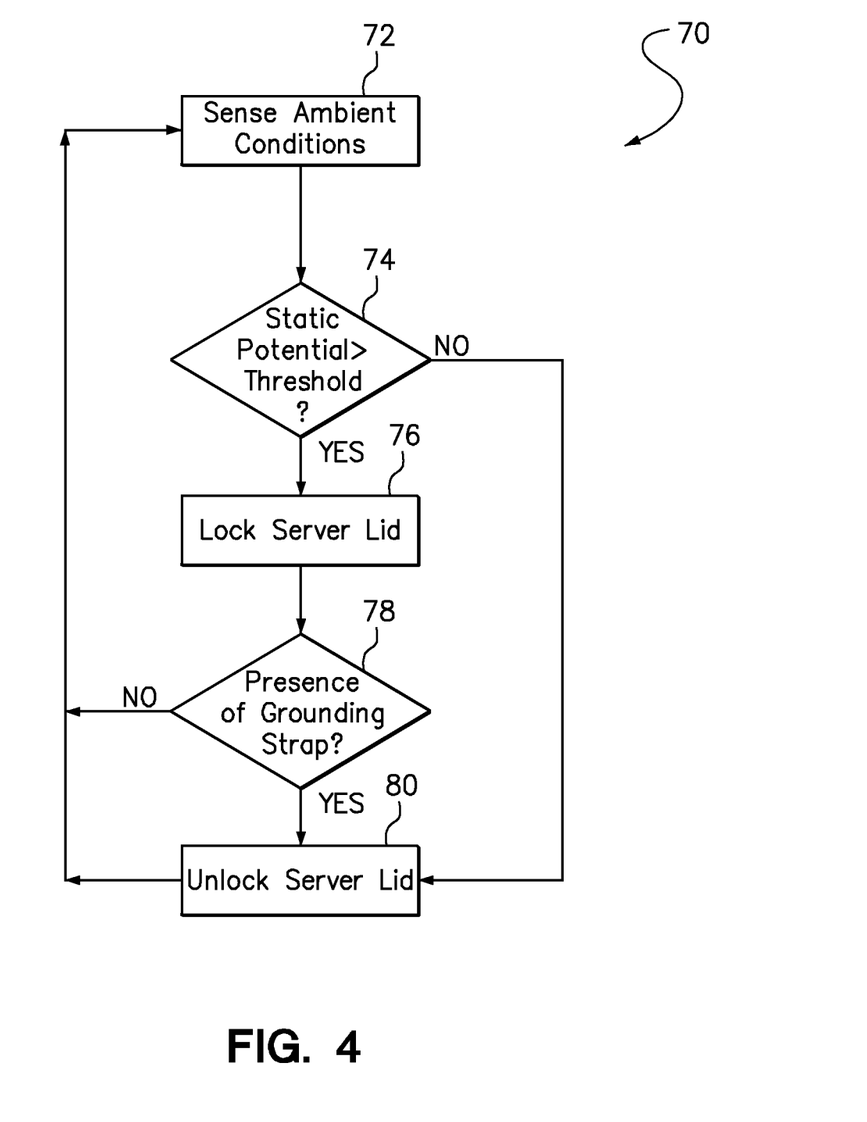
FIG. 4 is a flowchart of a method of controlling access into the server housing when environmental conditions are conducive to a buildup of electrostatic charge.

FIG. 4 is a flowchart of a method 70 of controlling access into the server housing when environmental conditions are conducive to a buildup of electrostatic charge. In step 72, the method senses ambient conditions in a datacenter containing a server. In step 74, it is determined whether the ambient conditions exceed predetermined threshold conditions representing a risk of electrostatic discharge. If the ambient conditions do not exceed the threshold conditions (i.e., a "No" determination in step 74), then the server lid is unlocked or remains unlocked in step 80. However, if the ambient conditions exceed the threshold conditions (i.e., a "Yes" determination in step 74), then step 76 locks the server lid in a closed position. If step 78 then determines that a grounding strap is present (i.e., a grounding strap plug is coupled to the grounding strap socket), the server lid is unlocked in step 80. If no grounding strap is determined to be present in step 78, then the method returns to step 72 to sense the ambient conditions and repeat the steps 72-80. Note, that in this embodiment, a server lid that has been previously locked may be unlocked, even without a grounding strap present, if the sensed ambient conditions no longer exceed the threshold conditions. In other words, if the ambient conditions have changed such that the risk of an electrostatic discharge has subsided, then the server may be accessed without using a grounding strap.

Figure 5:
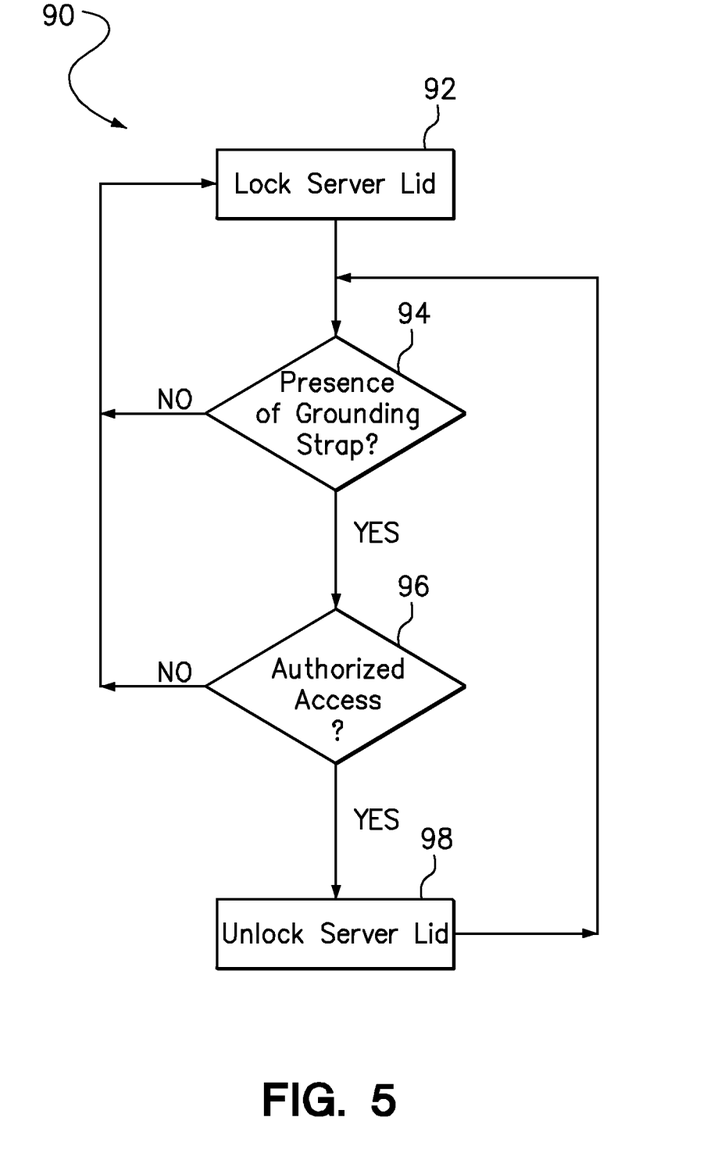
FIG. 5 is a flowchart of a method of controlling access into the server housing to avoid access by an unauthorized person.

FIG. 5 is a flowchart of a method 90 for controlling access into the server housing to avoid access by an unauthorized person. In this embodiment, the method 90 locks the server lid in step 92. The only way to unlock the server lid is to satisfy the two conditions of steps 94 and 96. Specifically, if a connected grounding strap is detected in step 94 and the identified grounding strap is determined to be associated with sufficient authorization in 96, then the server lid is unlocked in step 98. However, if the determination in either of steps 94 or 96 is negative, then the server lid will remain locked per step 92.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/ or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
sensing ambient conditions in a datacenter containing a server;
determining whether the ambient conditions exceed predetermined threshold conditions representing risk of electrostatic discharge;
locking a lid to the server in a closed position in response to the ambient conditions exceeding the predetermined threshold conditions;
detecting whether a grounding strap is connected to the server; and
unlocking the lid to the server in response to the grounding strap being connected to the server.

2. The method of claim 1, further comprising:
energizing a light emitting diode on an exterior surface of the server in response to locking the lid.

3. The method of claim 1, wherein sensing ambient conditions in a datacenter includes the sensing humidity.

4. The method of claim 3, further comprising:
communicating the sensed humidity level to a system management controller; and
the system management controller informing a management controller in the server of the humidity level over a management network.

5. The method of claim 4, further comprising:
displaying the sensed humidity on a remotely accessible user interface or a display on a front of the server.

6. The method of claim 1, wherein detecting whether a grounding strap is connected to the server includes detecting whether a grounding strap plug has been connected to a grounding strap socket on the server.

7. The method of claim 1, wherein the server is divided into multiple sections, each section having a separate lid and lid lock.

8. The method of claim 7, wherein determining whether the ambient conditions exceed predetermined threshold conditions representing risk of electrostatic discharge, includes determining whether the ambient conditions exceed a first set of predetermined threshold conditions representing a sensitivity to electrostatic discharge of components within a first section and determining whether the ambient conditions exceed a second set of predetermined threshold conditions representing a sensitivity to electrostatic discharge of components within a second section; and
wherein locking a lid to the server in a closed position in response to the ambient conditions exceeding the predetermined threshold conditions, includes locking a first lid to the server in a closed position in response to the ambient conditions exceeding the first set of predetermined threshold conditions and locking a second lid to the server in a closed position in response to the ambient conditions exceeding the second set of predetermined threshold conditions.

9. The method of claim 8, wherein the first lid provides access to a first section housing a CPU and the second lid provides access to a second section housing memory.

10. The method of claim 9, where a third lid provides access to a third section housing a fan, wherein the third lid has no lock.

11. A method, comprising:
locking a lid to the server in a closed position;
detecting that a grounding strap is connected to the server;
identifying the grounding strap connected to the server;
determining whether the identified grounding strap is authorized to unlock the lid; and
unlocking the lid to the server in response to the determining that the identified grounding strap connected to the server is authorized to unlock the lid.

12. The method of claim 11, wherein a systems management controller on the server stores predetermined data identifying a plurality of identified grounding straps that are authorized to unlock the lid.

13. The method of claim 11, wherein detecting that a grounding strap is connected to the server includes detecting that a grounding strap plug has been connected to a grounding strap socket on the server.

14. The method of claim 11, further comprising:
a service processor on the server detecting a physical attribute of the grounding strap, wherein the physical attribute is selected from resonance, charge capability, and electrical resistance, and wherein a grounding strap having a predetermined physical attribute is authorized to unlock the lid.

15. The method of claim 11, further comprising:
a service processor on the server reading an identification code from an electronically erasable programmable read-only memory (EEPROM) physically secured to the wrist strap device and in electronic communication with the wrist strap plug.

16. The method of claim 15, wherein the identification code identifies a user, an authorization level or an authorization type.

17. The method of claim 15, further comprising:
comparing the identification code with a stored set of records, each record including an identification code and an associated authorization code; and
unlocking the server lid in response to the identification code read from the EEPROM being associated with an authorization code required for access to the server.

18. The method of claim 17, wherein the authorization code required for access to the server varies based on the server type or model.

19. The method of claim 17, wherein the server is divided into multiple sections, each section having a separate lid and lid lock.

20. The method of claim 19, wherein the multiple sections include a first section housing a CPU and a second section housing memory.

* * * * *